United States Patent [19]
Peak, Jr.

[11] Patent Number: 5,982,202
[45] Date of Patent: Nov. 9, 1999

[54] METHOD AND APPARATUS FOR PRE-BIASING INPUTS TO A LATCHING PORTION OF A SENSING AMPLIFIER

[75] Inventor: Marvin L. Peak, Jr., Lewisville, Tex.

[73] Assignee: Dallas Semiconductor Corporation, Dallas, Tex.

[21] Appl. No.: 09/078,451

[22] Filed: May 13, 1998

[51] Int. Cl.$^6$ ........................................... G11C 7/06
[52] U.S. Cl. ............................................. 327/55; 365/203
[58] Field of Search .................. 327/51–57; 365/203

[56] References Cited

U.S. PATENT DOCUMENTS

| | | | |
|---|---|---|---|
| 4,061,999 | 12/1977 | Proebsting et al. | 365/182 |
| 4,255,679 | 3/1981 | White, Jr. et al. | 327/57 |
| 4,262,341 | 4/1981 | Mogi et al. | 365/205 |
| 4,418,293 | 11/1983 | McAlexander, III et al. | 327/57 |
| 5,057,718 | 10/1991 | Proebsting | 327/52 |
| 5,729,159 | 3/1998 | Gersbach | 327/52 |

OTHER PUBLICATIONS

Hirose, et al., "A 20–ns 4–Mb CMOS SRAM with Hierarchical Word Decoding Architecture", Oct. 5, 1990.

*Primary Examiner*—Toan Tran
*Attorney, Agent, or Firm*—Jenkens & Gilchrist P.C.

[57] ABSTRACT

A method and apparatus for pre-biasing a sensing amplifier. A sense amp bias transistor connects a first latching transistor and a second latching transistor to ground while the sense amplifier is being precharged. The connection of the first latching transistor and the second latching transistor to ground through the sense amp bias transistor discharges any additional charge which may have built up on the inputs of the first latching transistor and the second latching transistor as a result of a Vbump condition. The sense amp bias transistor is enabled concurrently with the precharging of the sense amplifier. The sense amp bias transistor can be enabled by a controller, or alternatively, enablement is effectuated by inverting the signal which precharges the sense amplifier.

6 Claims, 2 Drawing Sheets

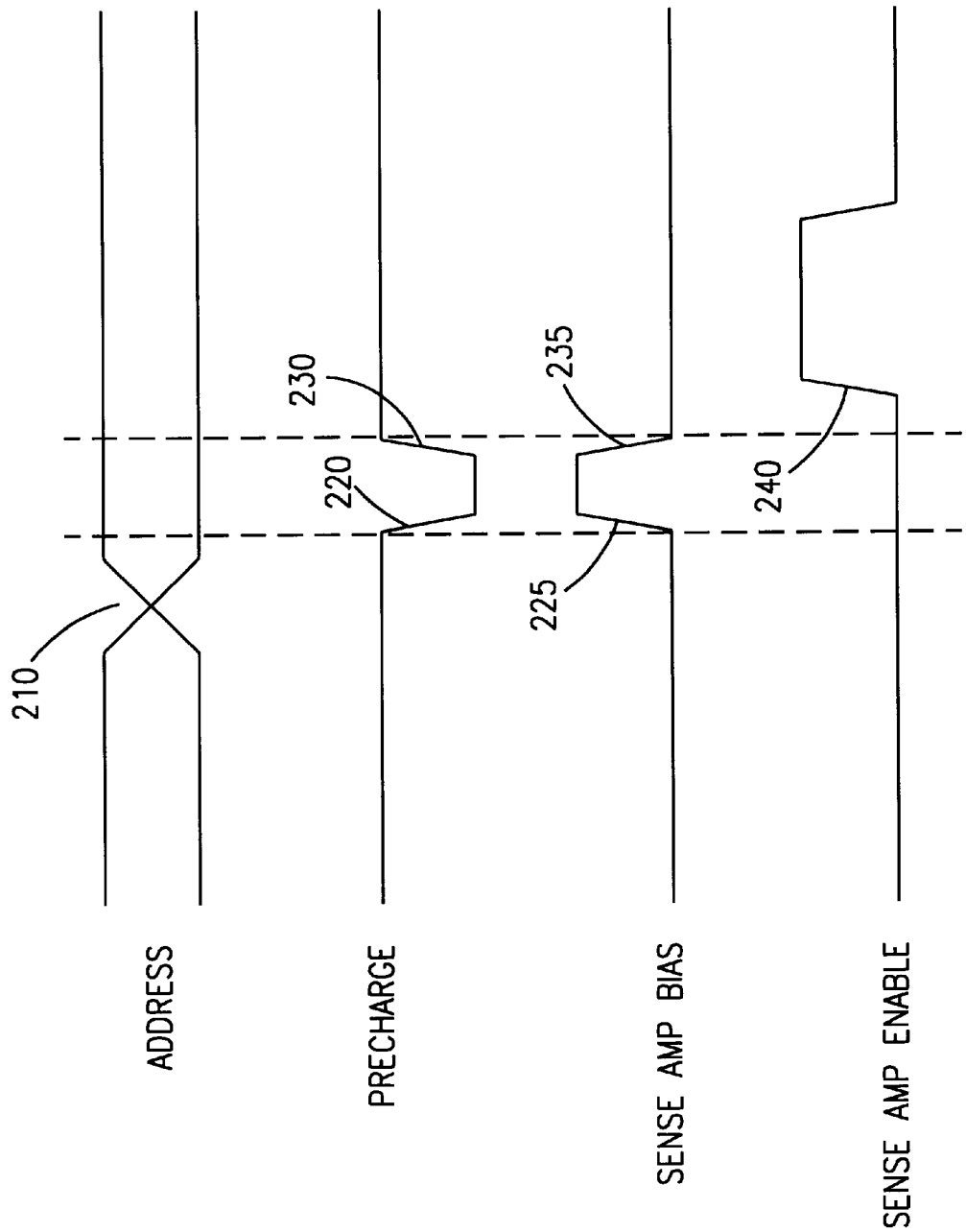

METHOD AND APPARATUS FOR PRE-BIASING INPUTS TO A LATCHING PORTION OF A SENSING AMPLIFIER

FIELD OF THE INVENTION

The present invention pertains in general to the biasing of inputs to sensing amplifiers, and in particular, but not by way of limitation, to a method and apparatus for pre-biasing inputs to a latching portion of a sensing amplifier used to read static random access memory.

BACKGROUND OF THE INVENTION

A sensing amplifier is often used to read Static Random Access Memory (SRAM) in computing devices. The outputs of the electronic circuits used in SRAMs are relatively weak, and therefore, are slow data line drivers. To provide greater data line driving capability and shorten state transition times of data lines, a sensing amplifier, whose operation is commonly known in the industry, is used to pre-charge the data lines to a known voltage, typically a supply voltage VDD which is 3.0 volts in modern circuits. Once the data lines are released from a pre-charged state, the SRAM data lines transition to the state currently stored in the particular SRAM memory location. The sensing amplifier senses the difference between a data line and its compliment data line as they transition to opposite states. Detection of the difference, by the sensing amplifier, is used to shorten the time required for the data lines to reach their final state.

As computing devices are increasingly powered by batteries, designers of such computing devices seek out technologies which are more energy efficient. In the case of sensing amplifiers, and semiconductors in general, "low leakage" semiconductors are often used. These semiconductors have a greater ability to hold a charge, and therefore, take a greater amount of time to passively discharge or "leak" a charge on a data line or a node into a substrate of the semiconductor. While the low leakage characteristic of the semiconductor reduces its power consumption, it creates an undesirable condition in the sensing amplifier when a sharp increase in the supply voltage VDD occurs.

A sharp increase in supply voltage VDD is conducted to inputs of a latching portion of the sensing amplifier. As the supply voltage VDD returns to nominal VDD voltage in a "leaky" semiconductor, the charge on the inputs of the latching portion of the sensing amplifier quickly leaks into the substrate and normal operation occurs. In low leakage semiconductors, however, the charge remains on the inputs for a longer period of time. The remaining charge sometimes causes a transistor, which connects the inputs of the latching portion to supply voltage VDD, to "turn-off" thereby isolating the inputs from the supply voltage VDD resulting in an undetermined voltage on the inputs to the latching portion of the sensing amplifier. The undetermined voltage on the inputs causes the sensing amplifier to operate in an unreliable manner.

It would be advantageous, therefore, to devise a method and apparatus for pre-biasing inputs to a latching portion of a sensing amplifier to a reliably known voltage. It would be further advantageous if such a method and apparatus performed reliably on "low leakage" semiconductors in the presence of a potentially varying supply voltage.

SUMMARY OF THE INVENTION

The present invention comprises a method and apparatus for pre-biasing a sensing amplifier. The present invention includes a sense amp bias transistor which connects a first latching transistor and a second latching transistor to ground while the sense amplifier is being precharged. The connection of the first latching transistor and the second latching transistor to ground through the sense amp bias transistor discharges any additional charge which may have built up on the inputs of the first latching transistor and the second latching transistor as a result of a Vbump condition. The sense amp bias transistor is enabled concurrently with the precharging of the sense amplifier. The sense amp bias transistor can be enabled by a controller, or alternatively, enablement is effectuated by inverting the signal which precharges the sense amplifier.

BRIEF DESCRIPTION OF THE DRAWINGS

A more complete understanding of the present invention may be had by reference to the following Detailed Description and appended claims, when taken in conjunction with the accompanying Drawings wherein:

FIG. 2 is a timing diagram for pre-biasing inputs to the latching portion of the sensing amplifier described in FIG. 1.

DETAILED DESCRIPTION

Figure 1:
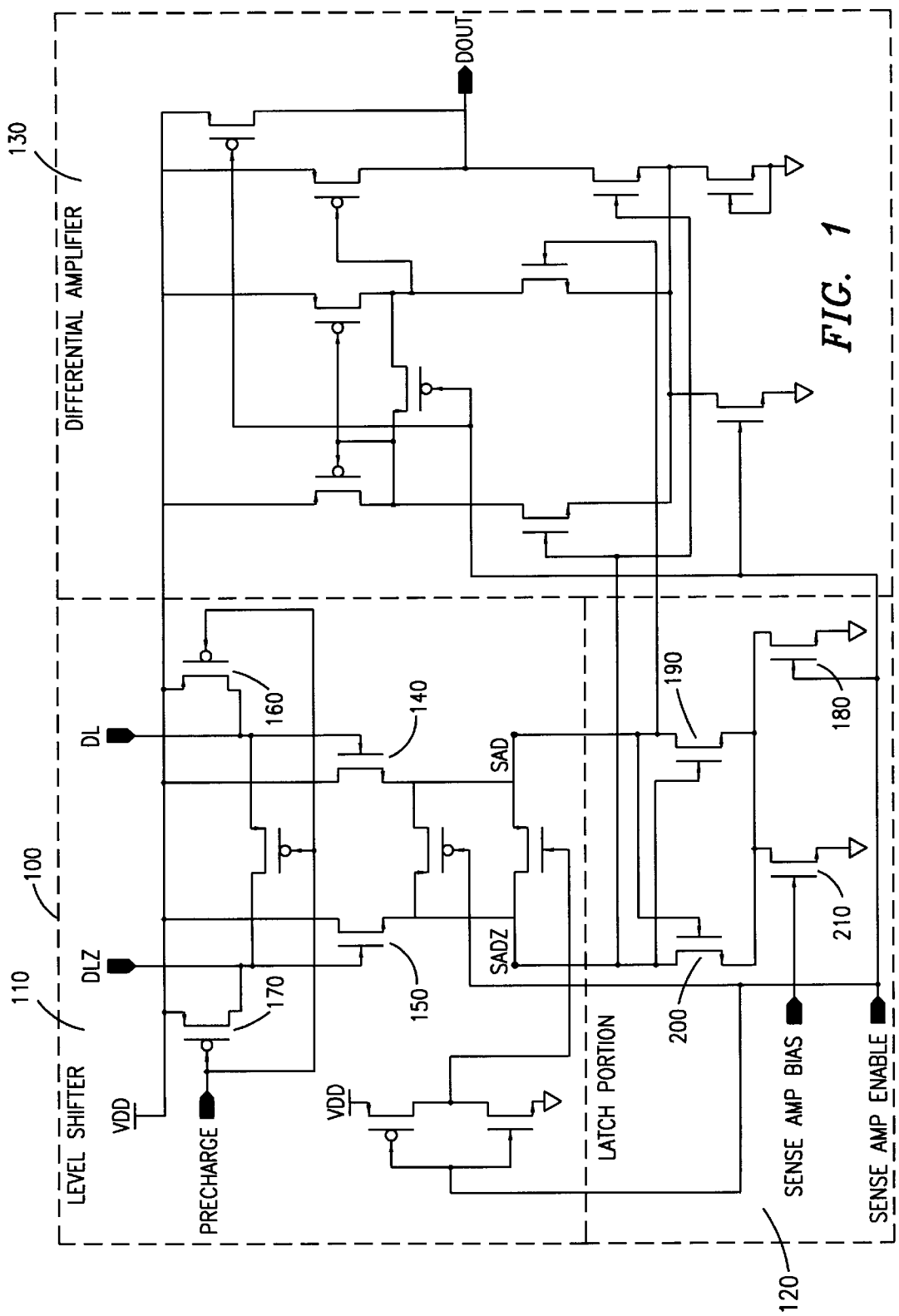
FIG. 1 is a circuit diagram of a preferred embodiment of an apparatus for pre-biasing inputs to a latching portion of a sensing amplifier.

Referring now to FIGS. 1 and 2, there is illustrated a circuit diagram of a preferred embodiment of an apparatus for pre-biasing inputs to a latching portion of a sensing amplifier and a timing diagram for pre-biasing inputs to the latching portion of the sensing amplifier described in FIG. 1. A sensing amplifier is shown generally at 100. The sensing amplifier 100 comprises a level shifter 110, a latching portion 120 and a differential amplifier 130 of the sensing amplifier 100. An output DL of an SRAM memory cell drives a gate of a first data line transistor 140 and a complimentary output DLZ of the SRAM memory cell drives a gate of a second data line transistor 150. A drain of the first data line transistor 140 and a drain of the second data line transistor 150 are connected to supply voltage VDD. A source of the first data line transistor 140 drives a first input SAD to both the latching portion 120 and the differential amplifier 130 of the sensing amplifier 100 while a source of the second data line transistor 150 drives a second input SADZ to both the latching portion 120 and the differential amplifier 130 of the sensing amplifier 100.

A drain of a transistor 160 and a drain of a transistor 170 are connected to supply voltage VDD while a source of transistor 160 drives the gate of the first data line transistor 140 and a source of transistor 170 drives the gate of the second data line transistor 150. Following a change in a read address of the SRAM, 210 of FIG. 2, a PRECHARGE signal is asserted, 220 of FIG. 2, by a controller (not shown). The PRECHARGE signal is applied to a gate of transistor 160 and a gate of transistor 170 causing transistors 160 and 170 to "turn-on" and drive data lines DL and DLZ to a voltage of VDD. Since the circuits of the memory cell of the SRAM are relatively weak, the data lines DL and DLZ are driven to VDD even though one of the data lines is being driven to zero volts by the SRAM since data lines DL and DLZ are complements of one another. While the PRECHARGE signal is asserted, the first data line transistor 140 and the second data line transistor 150 also "turn-on" which drives the inputs SAD and SADZ to a voltage of one transistor threshold voltage below VDD which is equal to VDD−1vt.

In past sensing amplifiers, the PRECHARGE signal is deactivated, 230 of FIG. 2, and a SENSE AMP ENABLE signal is asserted, 240 of FIG. 2. Disabling PRECHARGE causes transistors 160 and 170 to "turn-off" thereby allowing data lines DL and DLZ to transition to the state of the particular memory location of the SRAM. The signal SENSE AMP ENABLE is applied to a gate of a transistor 180 and asserting SENSE AMP ENABLE, 240 of FIG. 2, causes transistor 180 to "turn-on." As transistor 180 "turns-on," current begins to flow from the source of the first data line transistor 140 through a first latch transistor 190 and transistor 180 to ground. Current also begins to flow from the source of the second data line transistor 150 through a second latch transistor 200 and transistor 180 to ground. Eventually, the inputs to the latching portion 120 and the differential amplifier 130 of the sensing amplifier 100, SAD and SADZ, reach the state of the particular memory location of the SRAM. The differential amplifier 130 amplifies the state value and drives the output DOUT.

In low leakage semiconductors, however, a problem arises when there is an increase in the supply voltage VDD prior to PRECHARGE being asserted. An increase in supply voltage VDD, referred to as a "Vbump" causes an equal increase in the voltage applied to the gate, source and drain of transistors 140 and 150. Thus, the drains and gates of transistors 140 and 150 rise to a voltage of VDD+Vbump and the sources of transistors 140 and 150 rise to a voltage of VDD+Vbump–1vt. As the supply voltage VDD returns to nominal VDD, the drains and gates of transistors 140 and 150 return to nominal VDD.

In certain situations, the additional charge which has built up on the sources of transistors 140 and 150 as a result of the Vbump, together with the drop in voltage on the gates and drains of transistors 140 and 150 following the Vbump condition, cause transistors 140 and 150 to "turn-off" thus preventing the additional charge, which has built up on the sources of transistors 140 and 150, from discharging through transistors 140 and 150. In response to the assertion of SENSE AMP ENABLE, the resulting voltage causes an unstable condition on the inputs to the latching portion 120 and the differential amplifier 130, SAD and SADZ leading to unreliable operation of the sense amplifier 100. In prior sense amplifiers, the additional charge "leaks" into the semiconductor substrate and the sense amplifier returns to normal operation, however, in low-leakage semiconductors the charge remains long enough to cause unreliable operation of the sense amplifier 100.

The present invention eliminates the problem by connecting the inputs to the latching portion 120 and the differential amplifier 130, SAD and SADZ to ground through a sense amp transistor 210 while PRECHARGE is asserted. A drain of the sense amp bias transistor 210 is connected to the sources of the first latch transistor 190 and the second latch transistor 200 and the source of the sense amp transistor 210 is connected to ground. A SENSE AMP BIAS signal is asserted, 225 of FIG. 2, while the PRECHARGE is asserted, 220 of FIG. 2 which causes the sense amp transistor 210 to "turn-on" and discharge the inputs to the latching portion 120 and the differential amplifier 130, SAD and SADZ. By discharging the inputs, transistors 140 and 150 remain "turned-on" and the sense amplifier 100 operates in a stable manner. During the time between the both deassertion of PRECHARGE, 230 of FIG. 2, and SENSE AMP BIAS, 235 of FIG. 2, and the assertion of SENSE AMP ENABLE, 240 of FIG. 2, the inputs to the latching portion 120 and the differential amplifier 130, SAD and SADZ are pre-biased to VDD–1vt through the first data line transistor 140 and the second data line transistor 150.

Although the preferred embodiment of the apparatus and method of the present invention has been illustrated in the accompanying Drawings and described in the foregoing Detailed Description, it is understood that the invention is not limited to the embodiments disclosed, but is capable of numerous rearrangements, modifications and substitutions without departing from the spirit of the invention as set forth and defined by the following claims. For example, while the preferred embodiment described above depicted a particular implementation of field effect transistors, it is understood that with appropriate design considerations either p-type, n-type or bi-polar transistors may be used. Furthermore, transistors 180 and 210 can be combined into a single transistors wherein the gate of the resulting transistor is driven by the logical "OR-ing" of the SENSE AMP BIAS and the SENSE AMP ENABLE signals. In such an implementation, the differential amplifier 130 continues to be driven by the SENSE AMP ENABLE signal.

What is claimed is:

1. An apparatus for pre-biasing a sensing amplifier comprising:
    a sense amp bias transistor for connecting a first latching transistor and a second latching transistor to ground while the sense amplifier is precharged; and
    a controller for turning-on the sense amp bias transistor while the sense amplifier is precharged.

2. The apparatus as recited in claim 1, wherein the controller is effectuated by inverting a precharge signal used to precharge the sensing amplifier.

3. The apparatus as recited in claim 1, wherein the sense amp bias transistor and the first latching transistor and the second latching transistor are field effect transistors.

4. The apparatus recited in claim 3, wherein a source of the sense amp bias transistor is connected to ground and a source of the first latching transistor and a source of the second latching transistor are connected to a drain of the sense amp bias transistor.

5. A method for pre-biasing a sensing amplifier comprising the steps of:
    precharging the sensing amplifier; and
    concurrently connecting a first latching transistor and a second latching transistor to ground through a sense amp bias transistor to discharge inputs of the first latching transistor and the second latching transistor.

6. The method as recited in claim 5, further comprising the steps of
    allowing the input to the first latching transistor and the input to the second latching transistor to begin state transition; and
    enabling a differential amplifier of the sensing amplifier after the inputs to the first and the second latching transistors have begun state transition.

* * * * *